(12) United States Patent
Kapusta et al.

(10) Patent No.: US 10,208,382 B2
(45) Date of Patent: Feb. 19, 2019

(54) METHOD FOR MAKING A SEAM-SEALABLE NON-MAGNETIC LID AND PACKAGE

(71) Applicant: General Electric Company, Schenectady, NY (US)

(72) Inventors: Christopher James Kapusta, Delanson, NY (US); Marco Francesco Aimi, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 15/465,172

(22) Filed: Mar. 21, 2017

(65) Prior Publication Data
US 2017/0191167 A1 Jul. 6, 2017

Related U.S. Application Data

(62) Division of application No. 14/529,410, filed on Oct. 31, 2014.

(51) Int. Cl.
*B23K 35/00* (2006.01)
*B23K 1/00* (2006.01)
(Continued)

(52) U.S. Cl.
CPC .......... *C23C 28/023* (2013.01); *B23K 1/0016* (2013.01); *B23K 35/0222* (2013.01); *B23K 35/262* (2013.01); *B23K 35/3013* (2013.01); *B81C 1/00269* (2013.01); *C23C 14/025* (2013.01); *C23C 14/165* (2013.01); *C23C 14/3414* (2013.01); *C23C 14/58* (2013.01); *C23C 28/021* (2013.01); *C23F 1/00* (2013.01); *C23F 4/00* (2013.01); *C25D 3/50* (2013.01); *C25D 7/123* (2013.01);
(Continued)

(58) Field of Classification Search
CPC ............. H01L 23/3107; B81C 1/00269; B81C 2203/0109; B23K 1/00; B23K 1/0016; B23K 1/20; B23K 31/02
USPC .......... 228/124.6, 175, 203; 174/50.5, 50.51, 174/50.52, 520; 257/678
See application file for complete search history.

(56) References Cited

U.S. PATENT DOCUMENTS

| 4,506,108 A | 3/1985 | Kersch et al. |
| 4,582,240 A | 4/1986 | Lux et al. |

(Continued)

FOREIGN PATENT DOCUMENTS

| CN | 1305944 A | 8/2001 |
| CN | 102471846 A | 5/2012 |

(Continued)

OTHER PUBLICATIONS

Silicon Sensing Limited, Gemini Dual-Axis Accelerometer CAS200 Technical Datasheet, CAS200-00-0100-132 Rev 5, 2013, pp. 1-26.
(Continued)

*Primary Examiner* — Erin B Saad
(74) *Attorney, Agent, or Firm* — Ziolkowski Patent Solutions Group, SC; Jean K. Testa

(57) ABSTRACT

A non-magnetic lid for sealing a hermetic package. The lid includes a molybdenum substrate having a sputtered adhesion layer and a copper seed layer. The lid also includes a plated palladium solder base layer, and has a gold/tin solder preform attached to a sealing surface of the lid.

23 Claims, 4 Drawing Sheets

(51) Int. Cl.
| | |
|---|---|
| *C23C 28/02* | (2006.01) |
| *B81C 1/00* | (2006.01) |
| *B23K 35/02* | (2006.01) |
| *B23K 35/26* | (2006.01) |
| *B23K 35/30* | (2006.01) |
| *C23C 14/02* | (2006.01) |
| *C23C 14/16* | (2006.01) |
| *C23C 14/34* | (2006.01) |
| *C23C 14/58* | (2006.01) |
| *C23F 1/00* | (2006.01) |
| *C23F 4/00* | (2006.01) |
| *C25D 3/50* | (2006.01) |
| *C25D 7/12* | (2006.01) |
| *B23K 101/40* | (2006.01) |

(52) U.S. Cl.
CPC .... *B23K 2101/40* (2018.08); *B81C 2201/013* (2013.01); *B81C 2203/0109* (2013.01); *B81C 2203/019* (2013.01); *B81C 2203/037* (2013.01)

(56) References Cited

U.S. PATENT DOCUMENTS

| | | | |
|---|---|---|---|
| 4,866,505 | A | 9/1989 | Roberts et al. |
| 5,178,745 | A | 1/1993 | Abys et al. |
| 5,200,640 | A * | 4/1993 | Scheftic ............... H01L 23/047 257/693 |
| 5,779,081 | A | 7/1998 | Kimura et al. |
| 6,390,353 | B1 | 5/2002 | Lichtenberger |
| 6,661,090 | B1 | 12/2003 | Leung et al. |
| 6,848,610 | B2 | 2/2005 | Liu |
| 7,253,029 | B2 | 8/2007 | Geisler et al. |
| 7,743,963 | B1 * | 6/2010 | Chung ............... H01L 23/047 156/230 |
| 7,755,292 | B1 * | 7/2010 | Tuma ..................... G01J 3/10 313/238 |
| 8,536,663 | B1 | 9/2013 | Kuo et al. |
| 2003/0104651 | A1 | 6/2003 | Kim et al. |
| 2003/0160398 | A1 * | 8/2003 | K. Moidu .......... B65D 43/0216 277/641 |
| 2003/0230798 | A1 | 12/2003 | Lin et al. |
| 2004/0188496 | A1 | 9/2004 | Liu |
| 2005/0218506 | A1 * | 10/2005 | Geisler ............... B81C 1/00269 257/703 |
| 2007/0063336 | A1 | 3/2007 | Hase |
| 2007/0222008 | A1 | 9/2007 | Chen et al. |
| 2008/0271908 | A1 | 11/2008 | Yamamoto et al. |
| 2009/0309203 | A1 | 12/2009 | Seppala et al. |
| 2011/0013869 | A1 * | 1/2011 | Pezeshki ................ G02B 6/32 385/33 |
| 2011/0048757 | A1 | 3/2011 | Yamamoto et al. |
| 2012/0155055 | A1 | 6/2012 | Kang et al. |
| 2012/0177853 | A1 | 7/2012 | Gruenwald |
| 2014/0126167 | A1 | 5/2014 | Bozorgi et al. |
| 2015/0340298 | A1 | 11/2015 | Kothandapani |

FOREIGN PATENT DOCUMENTS

| | | | |
|---|---|---|---|
| CN | 103958394 A | | 7/2014 |
| DE | 10 2010 042543 A1 | | 1/2012 |
| GB | 1431919 A | * | 4/1976 ............ H01L 23/10 |
| GB | 1431919 A | | 4/1976 |
| JP | H07-211822 A | | 8/1995 |
| JP | 2003324228 A | * | 11/2003 |

OTHER PUBLICATIONS

Yang et al., "FEA Modeling of a Wafer Level Seam Sealing Approach for MEMS Packaging," 2004, 13 Pages.
Zhou et al., "Au/Sn Solder Alloy and Its Applications in Electronics Packaging," Coining, Inc., Institute of Microelectronics, Beijing, China, 1999.
"Nonmagnetic Materion Combo Lids Need for Nonmagnetic Properties in Lids," Materion website, Newsletter, Jun. 2013.
International Search Report for International Application No. PCT/US2015/057534, dated Feb. 17, 2016, 3 pages.
International Search Report for International Application No. PCT/US2015/057517, dated Feb. 2, 2016, 3 pages.
Extended European Search Report issued in connection with corresponding EP Application No. 15854648.1 dated May 8, 2018.
First Office Action and Search issued in connection with corresponding CN Application No. 201580058990.7 dated Jun. 26, 2018.

* cited by examiner

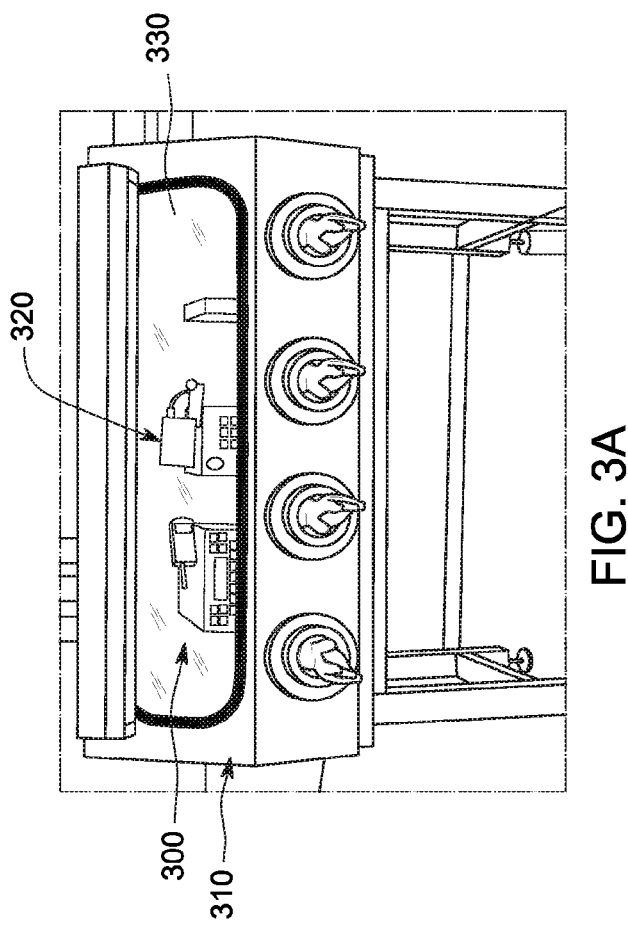
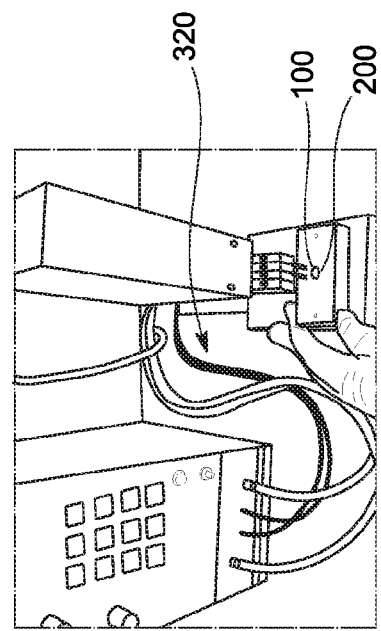
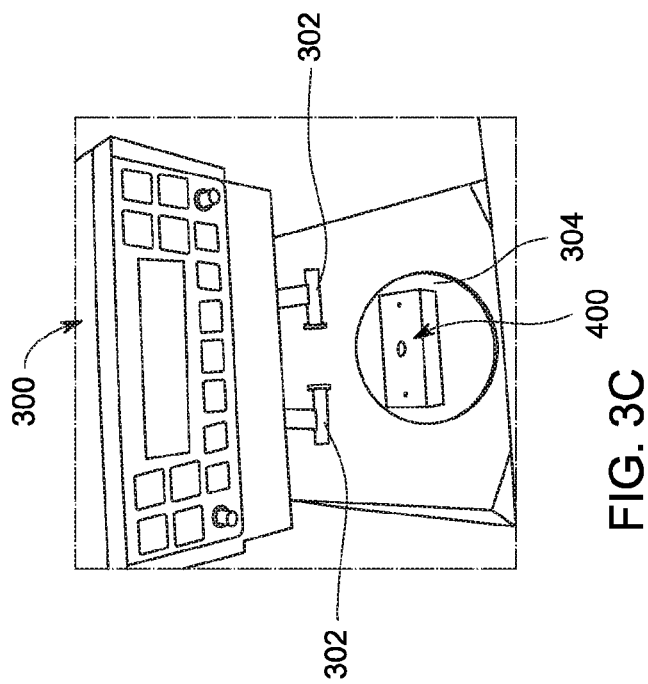

METHOD FOR MAKING A SEAM-SEALABLE NON-MAGNETIC LID AND PACKAGE

CROSS-REFERENCE TO RELATED APPLICATION

The present application is a divisional of, and claims priority to, U.S. patent application Ser. No. 14/529,410, filed Oct. 31, 2014, the disclosure of which is incorporated herein by reference in its entirety.

BACKGROUND

Technical Field

Embodiments of the invention relate generally to packaging of components that are sensitive to temperature, humidity, and/or atmospheric constituents. Particular embodiments relate to lids suitable for hermetically sealing packages that contain sensitive components such as microelectrical-mechanical systems ("MEMS") that are suitable for use in magnetic-resonance imaging ("MRI") equipment and in other applications that require non-magnetic components.

Discussion of Art

MEMS are devices that have their largest dimension within a range from about 20 micrometers to about 1 millimeter (0.02-1.0 mm). These very small electrical machines are useful in many applications, for example: ejecting ink from the cartridges of inkjet printers to put letters onto a page; measuring accelerations of a vehicle or of a handheld device such as a cellular phone or a game controller; transducing air pressure waves or surface vibrations to record sound; switching optical signals among fiber arrays; etc.

Generally, MEMS are useful for reliably providing highly responsive (small time constant) electromechanical functionality, such as motion sensing, within a small footprint or volume envelope. Accordingly, it has been desired for several years to make use of MEMS for sensing and control within MRI systems. However, it is necessary in MRI systems to provide components that are "non-magnetic," i.e., neither ferromagnetic nor paramagnetic.

To date, MEMS packaging has relied upon materials that are either ferromagnetic and/or paramagnetic. This has been the case in part because packages fabricated from non-magnetic materials, e.g., ceramics or plastics, have been understood to require closure methods that risked thermal damage, e.g., brazing, and/or chemical damage, e.g., volatile or moisture-permeable adhesives, to the MEMS enclosed within the packages. MEMs are sensitive to their environment, particulate or chemically, and also are sensitive to the packaging processing conditions, thus the need for a process to control the conditions and package environment. Indeed, MEMS typify a category of "sensitive" components that require special care in packaging. Other constituents of this category may include piezoelectric, paramagnetic, and shape memory alloy devices.

In view of the above, it is desirable to provide a sensitive component within a non-magnetic hermetic package. A key difficulty in providing such a package has been to devise a method of bonding a sensitive component into an open non-magnetic package cavity, then sealing the package cavity, without inducing thermal and/or chemical damage to the sensitive component.

BRIEF DESCRIPTION

Embodiments of the invention provide a non-magnetic lid for sealing a hermetic package. The lid includes a molybdenum substrate, a sputtered adhesion layer, a sputtered copper seed layer, and a plated palladium solder base layer, as well as a gold/tin solder preform attached at a sealing surface of the lid.

Aspects of the invention provide for making a non-magnetic seam-sealable lid for sealing a non-magnetic hermetic package, according to a method that includes forming a lid-shaped substrate from a molybdenum blank; sputtering onto the substrate an adhesion layer that includes, or consists essentially of, one or more materials such as: titanium, tantalum, or chromium; sputtering onto the adhesion layer a copper seed layer; electroplating onto the seed layer a palladium solder base layer; and attaching a gold/tin solder preform at a sealing surface of the lid.

Other aspects of the invention provide a method for making a non-magnetic MEMS package, which includes bonding a MEMS device within a non-magnetic package body that includes a sealing edge defined by a non-magnetic metallic seal ring, and sealing to the sealing edge of the package body a non-magnetic lid having a sealing surface that includes a gold/tin solder preform, which is sealed to the sealing edge of the package body.

Yet other aspects of the invention provide a metallic non-magnetic lid for sealing a hermetic package that includes a molybdenum substrate, a physical vapor deposited adhesion layer, a copper seed layer, a palladium solder base layer, and a gold/tin solder preform attached at a sealing surface of the lid.

DRAWINGS

The present invention will be better understood from reading the following description of non-limiting embodiments, with reference to the attached drawings, wherein below:

FIGS. 3A-3C are a perspective view of a glove box and detailed views of a tacker and seam sealer housed in the glove box.

DETAILED DESCRIPTION

Figure 1:
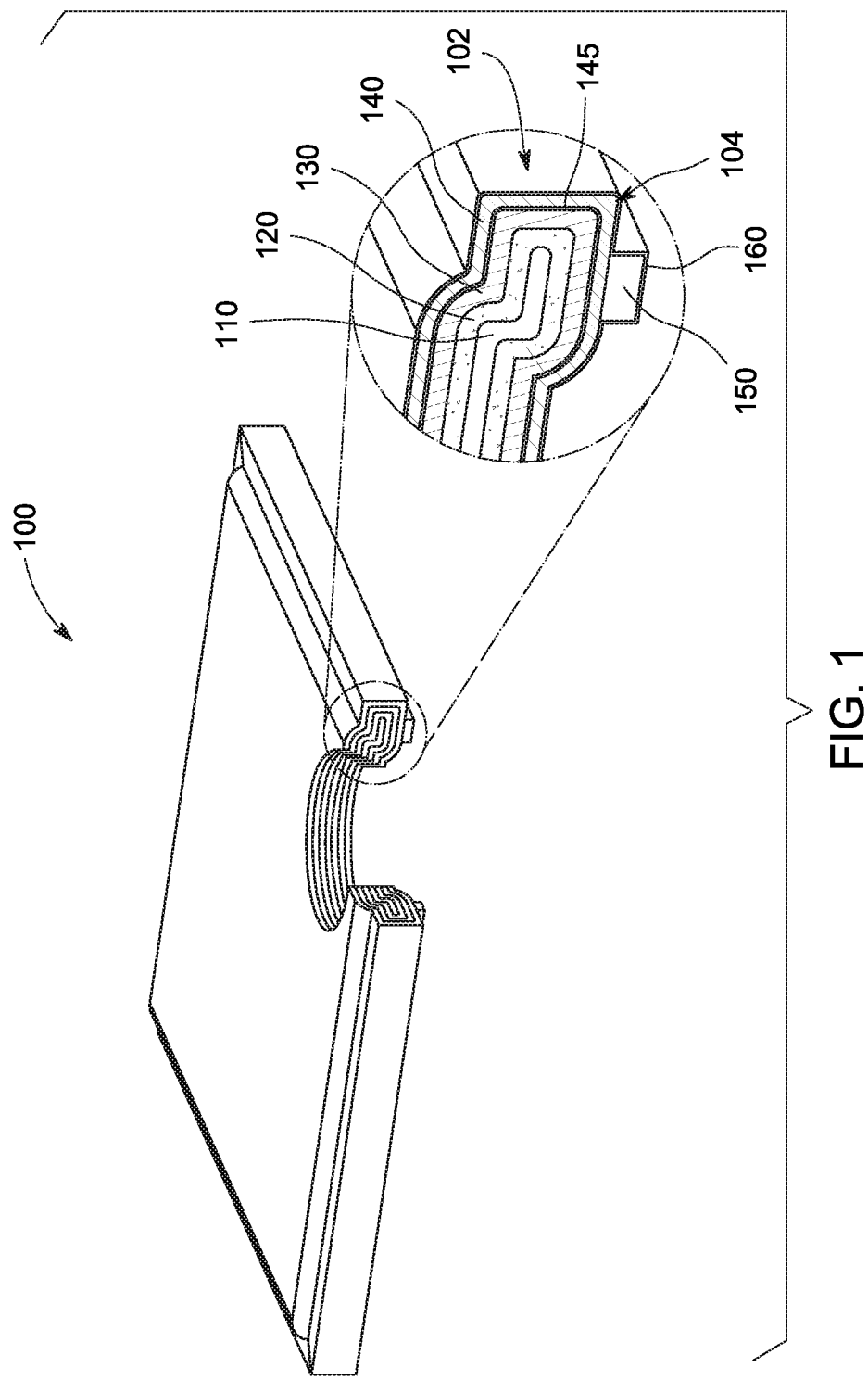
FIG. 1 is a perspective partially sectioned view of a non-magnetic lid according to an embodiment of the invention.

Reference will be made below in detail to exemplary embodiments of the invention, examples of which are illustrated in the accompanying drawings. Wherever possible, the same reference characters used throughout the drawings refer to the same or like parts, without duplicative description. Although exemplary embodiments of the present invention are described with respect to their use in MRI systems, embodiments of the invention are applicable for use in any setting that can benefit from non-magnetic packaging.

As used herein, the terms "substantially," "generally," and "about" indicate conditions within reasonably achievable manufacturing and assembly tolerances, relative to ideal desired conditions suitable for achieving the functional purpose of a component or assembly.

Figure 2:
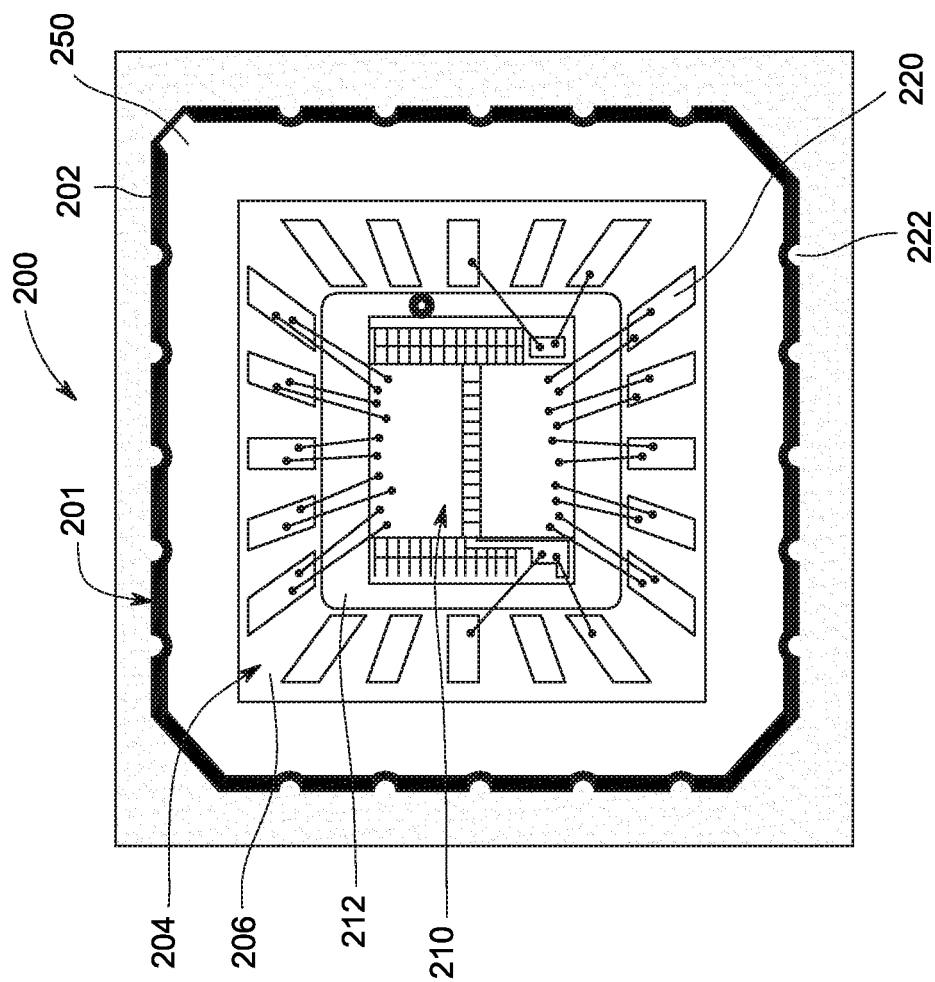
FIG. 2 is a top view of a non-magnetic package body.

Referring generally to FIGS. 1-4, in an exemplary embodiment, a seam-sealable non-magnetic lid 100, as shown in FIG. 1, is provided for sealing a non-magnetic MEMS package body 200, as shown in FIG. 2. The lid 100 is sealed onto the non-magnetic MEMS package body 200 by using a seam sealer 300, disposed within a dry air glove box 310, as shown in FIG. 3A. The seam sealer 300 applies electrical current from its electrodes 302 progressively to lid surface 100 and to a patterned metallic seal ring 250 of the package body 200, thereby locally reflowing together the lid with a gold/tin sealing preform 150 with the metallic seal ring 250. Completion of the seam sealing process produces a hermetic non-magnetic MEMS package 400, shown in perspective in FIG. 3C and shown as a partial sectioned schematic in FIG. 4.

As used herein, "hermetic" means obtaining a helium leak rate of $3 \times 10^{-8}$ mBarr L/s or less using a helium fine leak tester (e.g., an Alcatel™ ASM180 model) after two hours hold under at least 60 psi helium; and showing no bubbles in 125 C solution of FC-40; or equivalent test results.

Referring now to FIG. 1, the lid 100 includes a molybdenum substrate 110 that is shaped as the lid. For example, the substrate 110 may be stamped or cut to a flat shape, or it may be stamped or drawn to a concave or stepped shape. The substrate is at least about 5 mil (0.005 inch) thick, usually about 10 mil thick, but can be thicker. Generally, a minimum thickness for the substrate 110 is set by a desire to maintain dry air at atmospheric pressure within the package 400, even during depressurized air cargo transport, without permanent deformation of the substrate. The molybdenum substrate also desirably provides for thermal and electrical resistivities that facilitate the seam sealing process.

The lid 100 also includes, over the molybdenum substrate 110, an adhesion layer 120 that is at least about 500 angstrom thick and can be up to about 2000 angstrom thick. The adhesion layer can be sputtered onto the substrate 110 from titanium or from similar molybdenum-compatible metals such as tantalum or chromium. In certain embodiments, equivalent methods of physical vapor deposition (PVD) can be used in place of sputtering. PVD processes include cathodic arc, electron beam, resistive evaporative, pulsed laser, and magnetic sputtering deposition techniques. In certain embodiments, magnetic sputtering is the coating method, primarily due to chemical difficulties in electroplating or chemical vapor deposition (CVD). A sputtered adhesion layer has been found more uniform and provide better adhesion than a plated or CVD adhesion layer, and sputter systems provide back sputter capabilities to improve adhesion further. Other PVD techniques are believed equally suitable by comparison to electrochemical or CVD techniques. The adhesion layer 120 is sputtered onto opposite broad surfaces of the substrate, and is sputtered at least thick enough that the edges of the sputtered regions join to cover the edges of the substrate; thus, minimum acceptably thickness of the adhesion layer will vary according to thickness of the substrate. The adhesion layer 120 generally is not much thicker than needed to cover the edges of the substrate from the two broad surfaces.

Over the adhesion layer 120, the lid has a copper seed layer 130 that is sputtered to at least about 1000 angstrom thick. Copper has been found suitable for the seed layer 130 in terms of its compatibility with the titanium/tantalum/chromium adhesion layer, and in terms of its acceptance for electroplating palladium. The seed layer 130 is not directly sputtered onto the molybdenum because the adhesion layer 120 has been found to greatly enhance attachment of the seed layer 130 to the substrate 110. In some embodiments the seed layer 130 may be about 2000 angstrom thick, and in certain embodiments the seed layer may be as much as about 6000 angstrom thick. A thicker seed layer helps to buffer back-etch from a subsequent step of electroplating, and helps to cover edges of the substrate and allows easy plating of the palladium onto the copper without additional plating steps. On the other hand, increased thickness adds cost and weight, and an excessive thickness of copper, which is highly thermally and electrically conductive, may present problems with a later step of seam-sealing the lid to close the MEMS package.

Outside the seed layer 130, the lid 100 includes a palladium solder base layer 140 that is about 1-2 µm thick, where again the thickness is chosen to ensure that edges of the substrate 110 are covered. The palladium solder base layer 140 typically is electroplated onto the copper seed layer 130. Accordingly, the palladium solder base layer 140 will cover all surfaces of the lid 100 so as to mitigate tarnishing of the copper seed layer. In other embodiments, the solder base layer 140 may be sputtered onto just one surface (a sealing surface 104) of the lid 100. However, conformality of the solder base layer onto the edges of the lid 100 is helpful in order to enhance sealing action of the solder preform, as further discussed below. In certain embodiments, a gold strike layer 145 may be electroplated between the seed layer 140 and the solder base layer 130, in order to enhance attachment of the solder base layer to the seed layer.

On the sealing surface 104 of the lid 100, near its edges, the gold/tin solder preform 150 then is attached to the solder base layer 140, e.g., by tack welding. Overall, the materials and various layer thicknesses of the lid 100 are chosen so that the lid has bulk resistivity sufficiently high to focus current for spot seam sealing of the solder preform 150, as opposed to welding the lid itself. Thus, the inventive lid 100 allows for a low power seam sealing process that does not impose bulk heating of the lid or of a structure to which the lid is attached. Therefore, it is possible to use the lid for hermetic sealing of a MEMS package, without risking thermal damage to a MEMS device within the package. The lid 100 also may include a gold flash layer 160 between the palladium solder base layer 140 and the solder preform 150.

Figure 4:
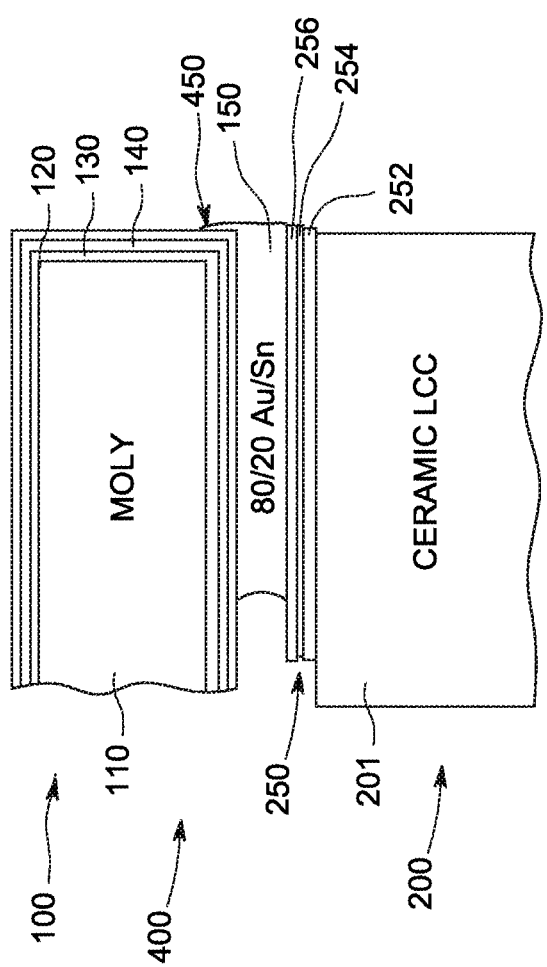
FIG. 4 is a partial sectioned view of an embodiment of the invention attached to the non-magnetic package body of FIG. 2.

Referring now to FIGS. 2 and 4, an example of a MEMS package body 200, suitable for closure by the lid 100, includes a wall 201 that is topped by the generally planar metallic seal ring 250. The seal ring 250 thereby defines a sealing edge of the package body. The wall 201 encloses a cavity 204. Within the cavity 204, a MEM (micro-electromechanical) device 210 is bonded to the package body 200.

Referring again to FIG. 3, the steps of tacking and seam sealing are accomplished within a glove box 310, which maintains clean air under dry conditions (less than about −40° C. dew point, 0% relative humidity, less than about 10,000 ppm water vapor). During tacking, the lid 100 is placed onto the package body 200 and the two components are placed together into a tack-welder 320 within the glove box. The tack welder 320 is used to lightly press down the lid 100 and to tack the lid with the gold/tin solder preform 150 onto the metallic seal ring 250 at one or two locations. Before tacking, the lid 100 and the package body 200 may be O2 ashed/cleaned and then purged with CDA (clean dry air as discussed below) and heated in a vacuum oven 330, which is connected with and opens into the glove box 310. For seam sealing, the package body 200 is transferred within the glove box onto a rotatable stage 304 of the seam sealer 300.

The seam sealer 300 then is operated to rotate the stage 304 with the lid and body, while retracting and extending the electrodes 302, so as to move the electrode contact along the edge 102 of the lid 100 that the preform 150 and the seal ring 250 will be progressively locally heated and welded to form an hermetic weld fillet between the solder base layer and an opposed seal ring. In this regard it is helpful to have the edges of the substrate 110 fully covered by the solder base layer 140 and subordinate layers 120, 130, so as to form a uniform fillet 450 that goes up the side edge of the lid 100, as shown in FIG. 4. Additionally it is helpful to have the lid and package body tacked together at only one location, where the electrodes 302 will start the seam-sealing process.

According to an aspect of the invention, seam sealing, which is a localized heating process, is usable instead of brazing (which is well known for sealing solder preforms). Although brazing has been conventional for sealing packages such as the inventive package 400, it turns out that the generalized high temperatures obtained during brazing can damage and deform the MEMS device that is meant to be enclosed within the hermetic MEMS package article. In order to implement seam sealing, however, it is necessary that the lid 100 must enable localized heating. Many non-magnetic metals make it very difficult to provide heat only in a local area, because such metals tend to be highly thermally and/or electrically conductive. Therefore, the materials and layer thicknesses of the lid 100 are carefully selected in order to optimize its thermal and electrical properties for seam sealing, which uses resistance welding—to locally heat and melt the preform 150.

Processes as described above result in an hermetic and non-magnetic MEMS package 400, which is usable in various applications including within MRI enclosures. Because dry air at atmospheric pressure is captured inside the package 400, it also may be usable in other environments where MEMs have not previously been considered.

Embodiments of the invention therefore provide a non-magnetic lid for sealing a hermetic package. The lid includes a molybdenum substrate, a sputter deposited adhesion layer, a copper seed layer, and a palladium solder base layer, as well as a gold/tin solder preform attached at a sealing surface of the lid. The adhesion layer may be sputtered. The substrate may be back-sputtered, chemically etched, and/or mechanically etched prior to sputtering the adhesion layer. The solder base layer may be at least about 10,000 angstrom (1 micron) thick. In some embodiments, the solder base layer may be no more than about 2 micron (2 µm) thick. The lid also may include, over the solder base layer an electroplated gold coating to about 1000 angstrom—2 µm thick. The lid may be vacuum baked prior to attaching the gold/tin preform. For example, the lid may be vacuum baked to achieve less than about 6 ppm H concentration in the palladium solder base layer, thereby reducing H available to diffuse from the solder base layer into a package to be sealed by the lid. The lid may have at its outside edges a corner radius of about 30 mil. The adhesion layer may be at least about 500 angstrom thick. The adhesion layer may be about 2000 angstrom thick. The seed layer may be at least about 1000 angstrom thick, or about 2000 angstrom thick. In some embodiments, the seed layer may be no more than about 6000 angstrom thick. In some embodiments, the adhesion layer may include one or more materials such as: titanium, tantalum, or chromium. For example, the adhesion layer may include, or may consist essentially of, titanium. The adhesion layer, the seed layer, and the solder base layer may cover at least a sealing surface of the substrate and an edge of the substrate that bounds the sealing surface. In some embodiments, the adhesion layer, the seed layer, and the solder base layer uniformly cover the substrate.

Aspects of the invention provide for making a non-magnetic seam-sealable lid for sealing a non-magnetic hermetic package, according to a method that includes forming a lid-shaped substrate from a molybdenum blank; physical vapor depositing (e.g., sputtering) onto the substrate an adhesion layer that includes, or consists essentially of, one or more materials such as: titanium, tantalum, or chromium; physical vapor depositing (e.g., sputtering) onto the adhesion layer a copper seed layer; electroplating onto the seed layer a palladium solder base layer; and attaching a gold/tin solder preform at a sealing surface of the lid. The method also may include at least one of back sputtering, chemically etching, or mechanically etching the substrate prior to sputtering the adhesion layer. The method also may include vacuum baking the lid prior to attaching the gold/tin solder preform, e.g., vacuum baking to less than about 6 ppm H concentration in the solder base layer. The adhesion layer may consist essentially of titanium.

Other aspects of the invention provide a method for making a non-magnetic hermetic package, which includes bonding a sensitive component within an interior cavity defined by non-magnetic walls that have a sealing edge defined by a non-magnetic metallic seal ring, and sealing to the sealing edge a non-magnetic lid, which has a sealing surface that includes a gold/tin solder preform, which is sealed to the sealing edge. The lid may include a molybdenum substrate, a physical vapor deposited adhesion layer that includes a material such as titanium, tantalum, or chromium, a copper seed layer, and/or a palladium solder base layer.

Yet other aspects of the invention provide a metallic non-magnetic lid for sealing a hermetic package that includes a molybdenum substrate, a physical vapor deposited adhesion layer, a copper seed layer, a palladium solder base layer, and a gold/tin solder preform attached at a sealing surface of the lid.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. While the dimensions and types of materials described herein are intended to define the parameters of the invention, they are by no means limiting and are exemplary embodiments. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, terms such as "first," "second," "third," "upper," "lower," "bottom," "top," etc. are used merely as labels, and are not intended to impose numerical or positional requirements on their objects. Further, the limitations of the following claims are not written in means-plus-function format and are not intended to be interpreted based on 35 U.S.C. § 112, sixth paragraph, unless and until such claim limitations expressly use the phrase "means for" followed by a statement of function void of further structure.

This written description uses examples to disclose several embodiments of the invention, including the best mode, and also to enable one of ordinary skill in the art to practice embodiments of the invention, including making and using any devices or systems and performing any incorporated methods. The patentable scope of the invention is defined by the claims, and may include other examples that occur to one of ordinary skill in the art. Such other examples are intended to be within the scope of the claims if they have structural elements that do not differ from the literal language of the claims, or if they include equivalent structural elements with insubstantial differences from the literal language of the claims.

As used herein, an element or step recited in the singular and proceeded with the word "a" or "an" should be understood as not excluding plural of the elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

Since certain changes may be made in the above-described article and method of making the lid, without departing from the spirit and scope of the invention herein involved, it is intended that all of the subject matter of the above description or shown in the accompanying drawings shall be interpreted merely as examples illustrating the inventive concept herein and shall not be construed as limiting the invention.

What is claimed is:

1. A method for making a seam-sealable non-magnetic lid, the method comprising:
    forming a lid substrate from a blank consisting of molybdenum;
    depositing an adhesion layer onto the lid substrate;
    forming a copper seed layer on the adhesion layer;
    forming a palladium solder base layer on the copper seed layer; and
    coupling a gold/tin solder preform to the palladium solder base layer.

2. The method of claim 1 further comprising at least one of back sputtering, chemically etching, or mechanically etching the lid substrate prior to sputtering the adhesion layer.

3. The method of claim 1 further comprising vacuum baking the lid substrate prior to attaching the gold/tin solder preform.

4. The method of claim 1 wherein depositing the adhesion layer comprises depositing one or more materials selected from the group consisting of titanium, tantalum, and chromium.

5. The method of claim 1 further comprising tack welding the gold/tin solder preform to the solder base layer.

6. The method of claim 1 wherein forming the lid substrate comprises one of stamping and drawing the lid substrate to one of a concave shape and a stepped shape.

7. The method of claim 1 further comprising depositing the adhesion layer onto opposing surfaces of the lid substrate.

8. The method of claim 1 further comprising forming the palladium solder base layer to surround all surfaces of the lid substrate.

9. A method for making a non-magnetic hermetic package comprising:
    providing a package body comprising non-magnetic walls and a metallic non-magnetic seal ring disposed on a sealing edge of the non-magnetic walls;
    bonding a component within an interior cavity defined by the non-magnetic walls of the package body;
    providing a metallic non-magnetic lid comprising a gold/tin solder preform coupled to a lid substrate consisting of molybdenum, the metallic non-magnetic lid further comprising an adhesion layer, a palladium base solder layer, and a copper seed layer positioned between the adhesion layer and the palladium solder base layer; and
    seam sealing the gold/tin solder preform to the metallic non-magnetic seal ring.

10. The method of claim 9 further comprising hermetically sealing the component within the interior cavity.

11. The method of claim 9 further comprising fabricating the metallic non-magnetic lid by:
    shaping a blank consisting of molybdenum into the lid substrate;
    depositing the adhesion layer onto the lid substrate;
    sputtering the copper seed layer onto the adhesion layer;
    applying the palladium solder base layer onto the copper seed layer via one of an electroplating technique and a sputtering technique; and
    tack welding the gold/tin solder preform to the palladium solder base layer.

12. The method of claim 9 further comprising applying electrical current to a surface of the lid substrate and to the metallic non-magnetic seal ring to locally reflow the gold/tin solder preform together with the metallic non-magnetic seal ring.

13. The method of claim 9 further comprising enclosing clean dry air within the interior cavity.

14. The method of claim 13 further comprising enclosing the clean dry air at a dew point less than about −40° C., a relative humidity of 0%, and a particulate concentration of less than about 10,000 ppm.

15. The method of claim 9 further comprising seam sealing the gold/tin solder preform to the metallic non-magnetic seal ring within a dry air glove box.

16. The method of claim 9 further comprising locally heating the gold/tin solder preform to seam seal the metallic non-magnetic lid to the metallic non-magnetic seal ring and create a fillet extending up over an outer edge of the metallic non-magnetic lid.

17. A method of manufacturing a metallic, non-magnetic lid that is seam-sealable onto a package, the method comprising:
    providing a substrate consisting of molybdenum; and
    depositing an adhesion layer, a copper seed layer, and a palladium solder base layer sequentially onto at least one surface of the substrate, wherein depositing each layer is accomplished by using one of physical vapor deposition, chemical vapor deposition, and electroplating.

18. The method of claim 17 further comprising attaching a gold/tin solder preform to the palladium solder base layer.

19. The method of claim 18 further comprising depositing the palladium solder base layer to surround all surfaces of the substrate.

20. The method of claim 18 further comprising vacuum baking the lid prior to attaching the gold/tin solder preform.

21. The method of claim 17 wherein depositing the adhesion layer comprises sputtering one of titanium, tantalum, and chromium.

22. The method of claim 17 further comprising depositing each of the adhesion layer, the copper seed layer, and the palladium solder base layer such that each layer surrounds the substrate.

23. The method of claim 17 further comprising depositing a gold strike layer between the copper seed layer and the palladium solder base layer.

* * * * *